(12) United States Patent
Schmid et al.

(10) Patent No.: US 9,093,517 B2
(45) Date of Patent: Jul. 28, 2015

(54) TID HARDENED AND SINGLE EVENT TRANSIENT SINGLE EVENT LATCHUP RESISTANT MOS TRANSISTORS AND FABRICATION PROCESS

(71) Applicant: Microsemi SoC Corporation, San Jose, CA (US)

(72) Inventors: Ben A. Schmid, Austin, TX (US); Fethi Dhaoui, Mountain House, CA (US); John McCollum, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 14/196,667

(22) Filed: Mar. 4, 2014

(65) Prior Publication Data

US 2014/0291771 A1 Oct. 2, 2014

Related U.S. Application Data

(63) Continuation-in-part of application No. 13/895,554, filed on May 16, 2013.

(60) Provisional application No. 61/772,476, filed on Mar. 4, 2013, provisional application No. 61/651,689, filed on May 25, 2012.

(51) Int. Cl.
| H01L 29/78 | (2006.01) |
| H01L 29/06 | (2006.01) |

(Continued)

(52) U.S. Cl.
CPC ............ *H01L 29/78* (2013.01); *H01L 29/0638* (2013.01); *H01L 29/0642* (2013.01); *H01L 29/0646* (2013.01); *H01L 29/1083* (2013.01); *H01L 29/0615* (2013.01); *H01L 29/0847* (2013.01)

(58) Field of Classification Search
CPC . H01L 29/78; H01L 29/0642; H01L 29/1083; H01L 29/0646; H01L 29/0847
See application file for complete search history.

(56) References Cited

U.S. PATENT DOCUMENTS

| 4,591,890 A | 5/1986 | Lund et al. |
| 5,026,656 A * | 6/1991 | Matloubian et al. .......... 438/164 |
| 5,286,995 A | 2/1994 | Malhi |

(Continued)

FOREIGN PATENT DOCUMENTS

WO 2008147172 12/2008

OTHER PUBLICATIONS

European Patent Office, International Search Report issued in PCT/US2013/041295, Sep. 23, 2013, pp. 1-3.

(Continued)

*Primary Examiner* — William Coleman
(74) *Attorney, Agent, or Firm* — Leech Tishman Fuscaldo & Lampl; Kenneth D'Alessandro, Esq.

(57) ABSTRACT

A radiation-hardened transistor is formed in a p-type body. An active region is disposed within the p-type body and has a perimeter defined by a shallow-trench isolation region filled with a dielectric material. Spaced-apart source and drain regions are disposed in the active region, forming a channel therebetween. A polysilicon gate is disposed above, aligned with, and insulated from the channel region. A p-type isolation ring is disposed in the p-type body separating outer edges of at least one of the source and drain regions from the perimeter of the active region. A body contact is disposed in the p-type isolation ring.

20 Claims, 9 Drawing Sheets

(51) Int. Cl.
*H01L 29/10* (2006.01)
*H01L 29/08* (2006.01)

(56) References Cited

U.S. PATENT DOCUMENTS

| | | | | |
|---|---|---|---|---|
| H1435 | H | * | 5/1995 | Cherne et al. ............ 257/347 |
| 5,747,354 | A | * | 5/1998 | Yoshida ............ 438/291 |
| 6,933,560 | B2 | | 8/2005 | Lee et al. |
| 6,943,426 | B2 | * | 9/2005 | Williams et al. ............ 257/500 |
| 7,541,247 | B2 | | 6/2009 | Voldman |
| 7,569,884 | B2 | | 8/2009 | Lee |
| 2002/0195659 | A1 | | 12/2002 | Jimbo et al. |
| 2004/0241950 | A1 | * | 12/2004 | Olofsson ............ 438/301 |
| 2007/0018258 | A1 | | 1/2007 | Chen et al. |
| 2008/0191277 | A1 | | 8/2008 | Disney et al. |
| 2009/0096022 | A1 | | 4/2009 | Chang et al. |
| 2009/0108348 | A1 | | 4/2009 | Yang et al. |
| 2009/0224336 | A1 | | 9/2009 | Liu et al. |
| 2011/0084324 | A1 | * | 4/2011 | Donnelly et al. ............ 257/296 |
| 2013/0285147 | A1 | * | 10/2013 | Dhaoui ............ 257/368 |

OTHER PUBLICATIONS

European Patent Office, International Search Report issued in PCT/US2013/038270, Nov. 19, 2013, pp. 1-4.
International Bureau of WIPO, International Preliminary Report on Patentability issued in PCT/US2013/038270, Oct. 28, 2014, pp. 1-7.
International Bureau of WIPO, International Preliminary Report on Patentability issued in PCT/US2013/041295, Nov. 25, 2014, pp. 1-5.

* cited by examiner

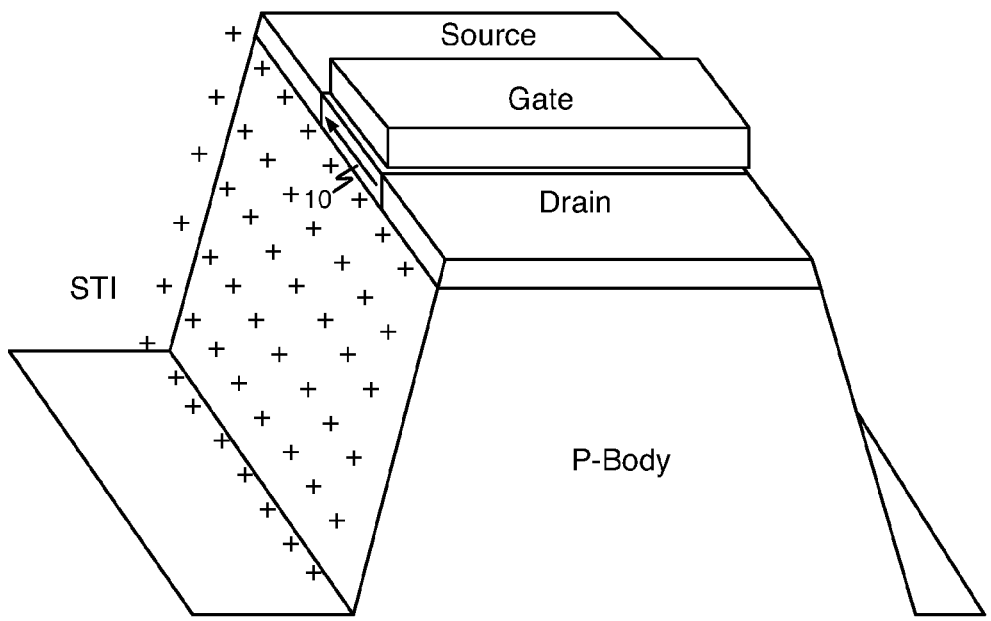
FIGURE 1A
(PRIOR ART)
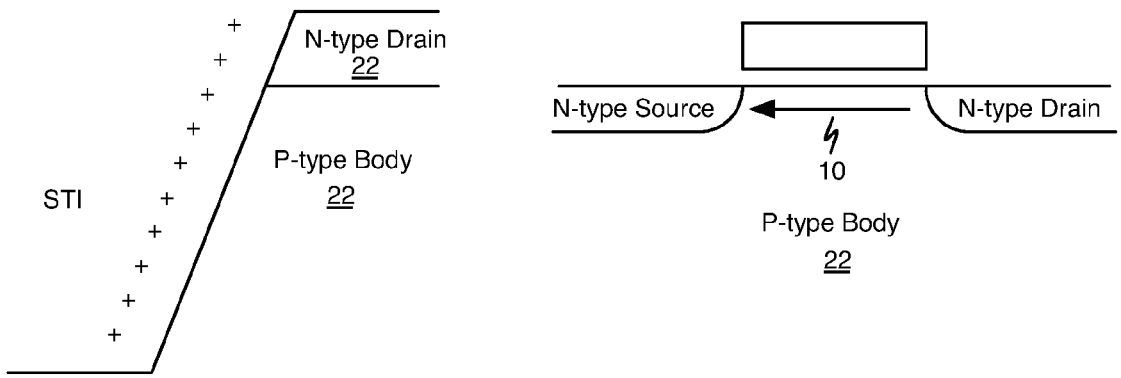
FIGURE 1B
(PRIOR ART)
FIGURE 1C
(PRIOR ART)

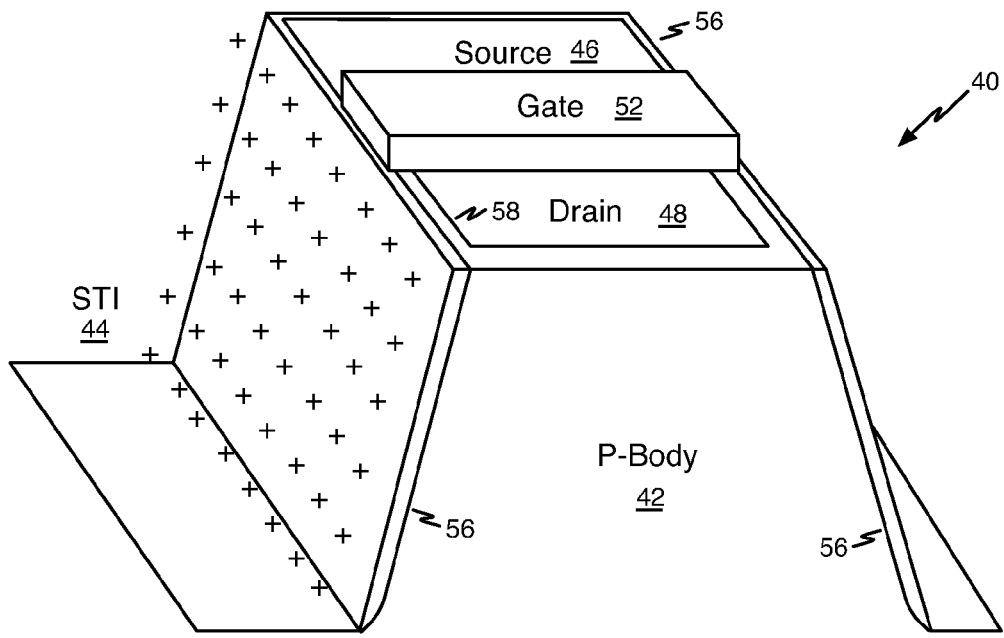
FIGURE 6A
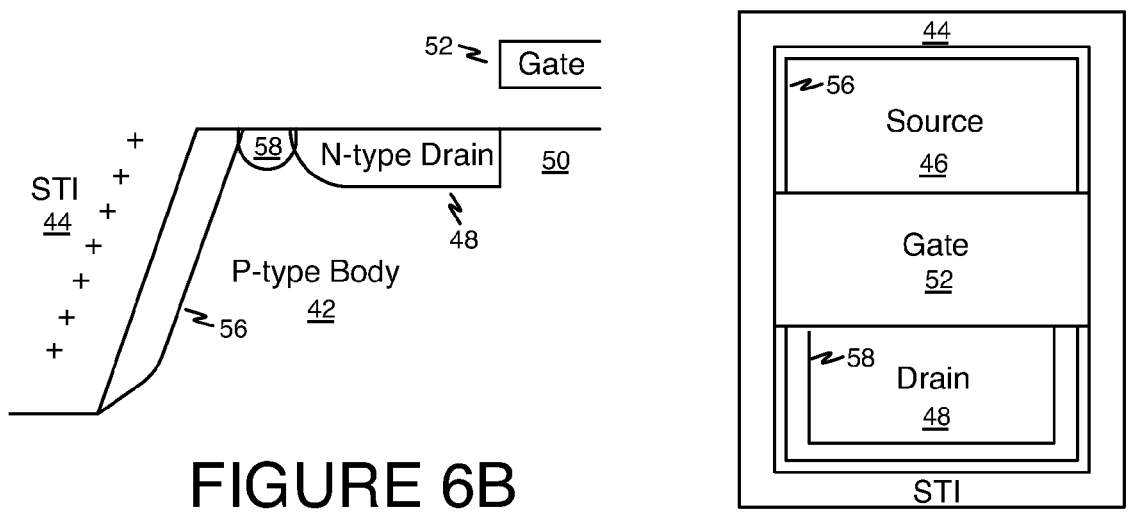
FIGURE 6B
FIGURE 6C

TID HARDENED AND SINGLE EVENT TRANSIENT SINGLE EVENT LATCHUP RESISTANT MOS TRANSISTORS AND FABRICATION PROCESS

CROSS REFERENCE TO RELATED APPLICATIONS

This application is a continuation-in-part of prior co-pending U.S. patent application Ser. No. 13/895,554, filed May 16, 2013, and entitled "TID Hardened MOS Transistors and Fabrication Process," which claims the priority benefit of U.S. Provisional Patent Application No. 61/651,689, filed May 25, 2012, and entitled "TID Hardened MOS Transistors and Fabrication Process." This application also claims the benefits of U.S. Provisional Patent Application No. 61/772,476, filed Mar. 4, 2013, and entitled "TID Hardened and Single Event Transient Single Event Latchup Resistant MOS Transistors and Fabrication Process" all of which are incorporated herein by reference in their entirety.

BACKGROUND OF THE INVENTION

1. Field of the Invention

The present invention relates to semiconductor technology, and specifically to MOS technology. More particularly, the present invention relates to radiation hardened MOS transistors and to methods for fabricating such transistors.

2. Description of Related Art

The present invention is intended to solve the problem of transistor off-state leakage in n-channel MOS (NMOS) high-voltage (HV) transistors due to ionizing radiation. Ionizing radiation over time deposits positive charge in the insulating materials surrounding the transistor, causing NMOS devices to exhibit large parasitic drain-to-source leakages by creation of an inverted channel along the transistor sidewalls. These large leakage currents limit the usable lifetime of NMOS transistors in radiation environments. Due to the lower body doping of HV transistors, these devices are especially vulnerable to this failure mechanism.

Total Ionizing Dose (TID) is a long-term degradation of electronics due to the cumulative energy deposited in a material. Typical effects include parametric failures, or degradations in device parameters such as increased leakage current, threshold voltage shifts, or functional failures. Major sources of TID exposure in the space environment include trapped electrons, trapped protons, and solar protons, as well as trapped charge in dielectrics caused by X-Rays and Gamma Rays and high-energy ions.

There are several transistor degradation modes caused as a result of ionization dose. One is a shift in threshold voltage $V_t$. The $V_t$ of NMOS devices shifts in a negative direction and tends to turn on due to hole trapping in the gate oxide. Another is sidewall leakage.

The $V_t$ of parasitic isolation sidewall transistors also shifts in a negative direction. For NMOS transistors, as $V_t$ becomes more negative, sidewall leakage increases exponentially as the parasitic transistor starts to turn on at a lower threshold voltage. This is the primary lifetime limitation for standard medium voltage (MV) and high-voltage (HV) NMOS devices. Shallow-trench isolation (STI) accumulates positive charge during irradiation. The positive charge turns on parasitic sidewall transistors at the STI edges, forming an uncontrolled conducting path from drain to source.

FIGS. 1A through 1C illustrate the effects of TID on a typical linear NMOS STI isolated transistor. FIG. 1A is an isometric view of the structure, FIG. 1B is a cross-sectional view of the left-most portion of the structure taken through the drain, and FIG. 1C is a side view of the edge of the structure at the inner boundary of the STI isolation trench. Positive charge built up in the STI oxide (shown as multiple "+" signs in FIGS. 1A and 1B) lowers the threshold of the transistor, causing leakage current to flow from the drain to source along the edge of the structure through a parasitic transistor that exists at the gate edge proximate to the STI boundary, as shown by arrow 10 in FIGS. 1A and 1C.

Existing prior art layout solutions to this problem include transistors formed using annular gate geometries in which there are no isolation sidewalls connecting the drain and source nodes, because the gate completely encircles the drain of the transistor.

FIGS. 2A and 2B are top and cross-sectional views of an annular-gate transistor and illustrate an example layout of an existing annular-gate solution to the ionizing radiation problem for fabricating HV NMOS devices. The annular-gate transistor is fabricated within a boundary defined by an STI structure comprising a shallow trench filled with an insulating material, such as a deposited silicon dioxide. An annular polysilicon gate is formed and defined in the center of the transistor region defined by the STI structure. An annular source region and a square-shaped drain region are then implanted by a self-aligned-gate process using the annular gate as an implant mask, as is known in the art. The source comprises the region outside of the gate abutting the inner perimeter of the STI structure and the drain is formed through an aperture in the center of the gate.

As may be seen from an examination of FIGS. 2A and 2B, there is no drain edge at the inner STI periphery, since the annular source completely occupies the edge of the transistor structure. While this prevents the existence of a parasitic transistor at the gate edge at the STI region, since there is no gate edge at this location in the transistor, this solution to the problem is not entirely satisfactory.

In particular, it is difficult to scale width and length for transistor design in such structures. For example, SPICE models cannot easily be used to determine effective widths and lengths of such devices. Curved and circular structures are not provided for in conventional simulation software to model transistors. In addition, as geometries shrink, the right-angle edges of the structures in the annular gate transistor become disallowed in design rules, creating a lower limit on the size of such transistors. For example, below 65 nm, design rules prohibit 90° or even 45° angles on polysilicon over diffusion.

Another prior art solution to the problem when using lateral transistors with STI isolation has been to add an additional p-type implant to the diffusion sidewall. This implant is performed after trench etch and before trench fill. This solution delays the onset of parasitic leakage, but does not eliminate it. In addition, the additional sidewall implant degrades junction breakdown, which is problematic in HV transistors.

Another problem encountered in HV NMOS transistors is single-event transients and single-event latchups, caused by a heavy ion striking the drain region of the device while biased. Recovery from the strike is limited by the impedance to the body tap. This determines both the rate at which the (primary) injected charge can be collected, as well as how much transient forward bias develops at the junction, injecting additional (secondary) charge.

Existing solutions to the problem of HV NMOS single-event transients and single-event latchups involve the addition of additional well-tap diffusions to minimize the number of squares between a transistor active diffusion and tap diffusion. However these also increase the die area.

SUMMARY OF THE INVENTION

According to a first aspect of the present invention, a lateral n-p junction is created in the transistor to isolate the device channel from the sidewall of the STI isolation structure on both the source and drain regions of the transistor. Additional p-type implants may be added in this isolation ring to increase the parasitic $V_t$ and improve TID immunity. The doping profile can be engineered so as not to degrade junction breakdown. In this embodiment of the present invention, the drain of the transistor is isolated from STI by a lateral junction.

According to another aspect of the present invention, a lateral n-p junction is created in the transistor to isolate the device channel from the sidewall of the STI isolation structure on only the drain region of the transistor.

According to another aspect of the present invention, additional p-type implants may be employed to increase TID immunity. The p-type implant may be separated from the edge of the n-type drain to preserve drain-body junction breakdown performance. The N+ source/drain implant is overlapped by a lighter n-type lightly-doped-drain (NLDD) implant, grading the n-type side of the junction. Similarly, the P+ body implant is overlapped by a lighter p-type lightly-doped-drain (PLDD) implant, grading the p-type side of the junction. In between is a region of very lightly-doped p-type high voltage p-well, further grading the p-type side of the diode. Finally, a higher energy p-type implant is added to provide improved conduction deeper near the N+ to high-voltage p-well junction.

The present invention is also designed to solve the problem of HV NMOS single-event transients and single-event latch-ups, caused by a heavy ion striking the drain region of the device while biased. Recovery from the strike is limited by the impedance to the body tap. This determines both the rate at which the (primary) injected charge can be collected, as well as how much transient forward bias develops at the junction, injecting additional (secondary) charge.

According to another aspect of the present invention, the shallow-trench isolation between source/drain and body diffusions is replaced by an engineered junction. This butted junction greatly reduces the impedance from the source or drain to the body tap, while maintaining the same junction breakdown performance as the trench-isolated device. This scheme can be used to make the standard tap region or guard ring less resistive and more immune to set transient or latchup.

According to another aspect of the present invention, a salicided body (bulk) contact is located in a region of the engineered junction. This also reduces the impedance from the source or drain to the body tap, while maintaining the same junction breakdown performance as the trench-isolated device. This scheme can be used to make the standard tap region or guard ring less resistive and more immune to single event transient or single event latchup events.

BRIEF DESCRIPTION OF THE DRAWINGS

Additional advantages and details of the invention are explained below with reference to the exemplary embodiments illustrated in the accompanying schematic figures, in which like reference numbers identify like parts throughout.

FIGS. 1A, 1B, and 1C are diagrams of an example layout of prior art STI HV NMOS devices, illustrating the problems addressed by the present invention.

FIGS. 6A, 6B, and 6C are diagrams of an example layout of an STI isolated linear HV NMOS device according to another illustrative embodiment of the present invention.

DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 3A:
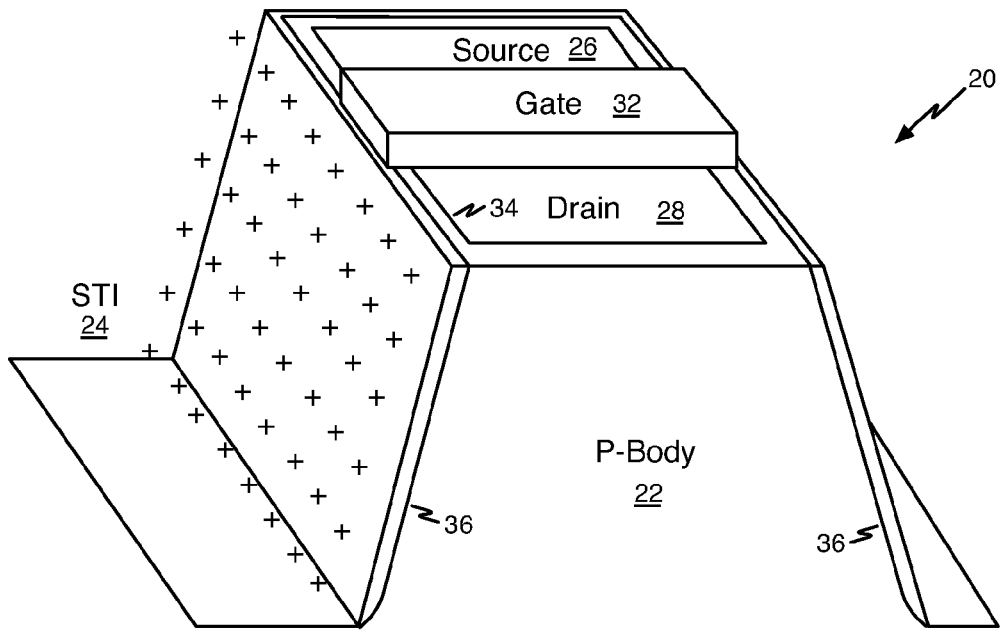
FIGS. 3A, 3B, and 3C are diagrams of an example layout of an STI isolated linear HV NMOS device according to one illustrative embodiment of the present invention.
Figure 3B:
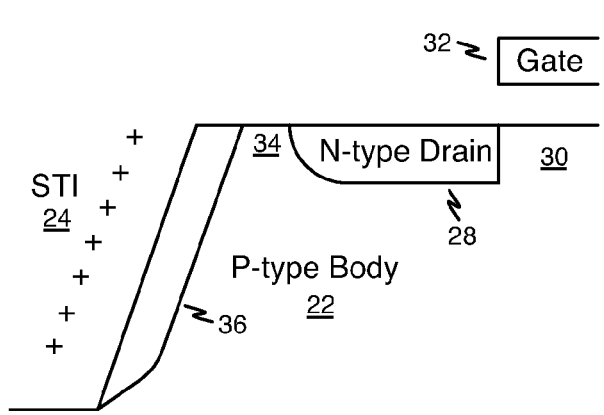
Figure 3C:
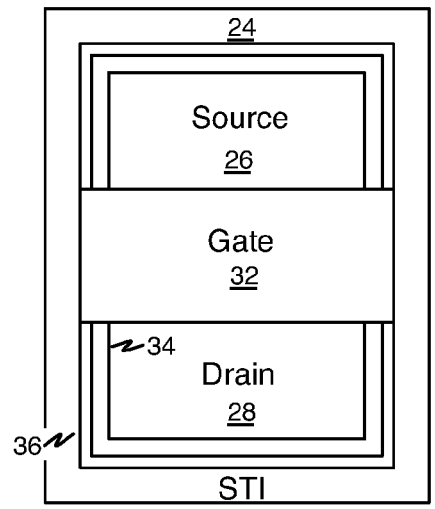

Referring now to FIGS. 3A, 3B, and 3C, the diagrams depict an illustrative embodiment of the present invention. According to this aspect of the present invention, the source and drain nodes of the NMOS transistor are electrically isolated from the trench sidewall by a lateral diode. This diode is junction engineered to provide isolation after exposure to ionizing radiation while maintaining the full junction breakdown performance of the original radiation-sensitive layout.

FIG. 3A is a three-dimensional drawing of the structure of a transistor 20 fabricated according to one aspect of the present invention. FIG. 3B is a cross-sectional view of the drain side of transistor 20 taken in a direction parallel to the channel. FIG. 3C is a top view of the transistor 20.

Transistor 20 is formed in p-type body 22, which may be a high-voltage triple well, including an isolated body p-well in a deep-n-well in a p-substrate. Typical doping levels for such a p-well body 22 are about $1 \times 10^{16}$ atoms/cm$^3$. Transistor 20 is isolated by STI region 24 that surrounds the transistor 20. Source 26 and drain 28 define a channel region 30 disposed under a polysilicon gate 32. A typical doping level for source 26 and drain 28 is from about $1 \times 10^{19}$ atoms/cm$^3$ to about $1 \times 10^{20}$ atoms/cm$^3$. The depth of a "deep-n-well" ranges from about 1.2 µm to about 3.0 µm in a process where the isolated p-type body well junction depth ranges from 0.8 µm to 1.5 µm and an n-type well junction depth is from 0.8 µm to 1.5 µm.

In this embodiment of the present invention, the source 26 and drain 28 of the NMOS transistor 20 are electrically isolated from the trench sidewall by a lateral diode formed in cooperation with region 34, as will be described further. This may be thought of as effectively replacing the parasitic sidewall transistors, which exist in parallel with the channel of the device with a pair of parasitic transistors having progressively higher $V_t$. The leakage is determined by the highest $V_t$ device, which can potentially withstand many times higher radiation doses before the onset of undesired conduction. The lateral diode space thereby allows these more highly-doped parasitic regions which raise the $V_t$ of the parasitic devices without sacrificing the breakdown voltage.

As indicated above, this lateral diode is formed by pulling the n-type source/drain implants back from the diffusion edge, leaving a region 34 of the p-type well or substrate doping, and, thus, forming the lateral diode by the interface of drain 28 and region 34. The perimeter of the diffusion is then implanted with additional p-type implant 36 to increase the parasitic threshold voltage and prevent punch-through to the inverted sidewall. P-type implant 36 is not shown at the front of the three-dimensional drawing of FIG. 3A in order to show the p-type body 22, although it is present there as shown in the top view of FIG. 3C. In a typical embodiment, the p-type implant 36 can be at a level of about $3 \times 10^{16}$ to about $1 \times 10^{18}$ atoms/cm$^3$. In this device, the parasitic channel still exists under the gate, but it is disconnected from the transistor 20.

Figure 4A:
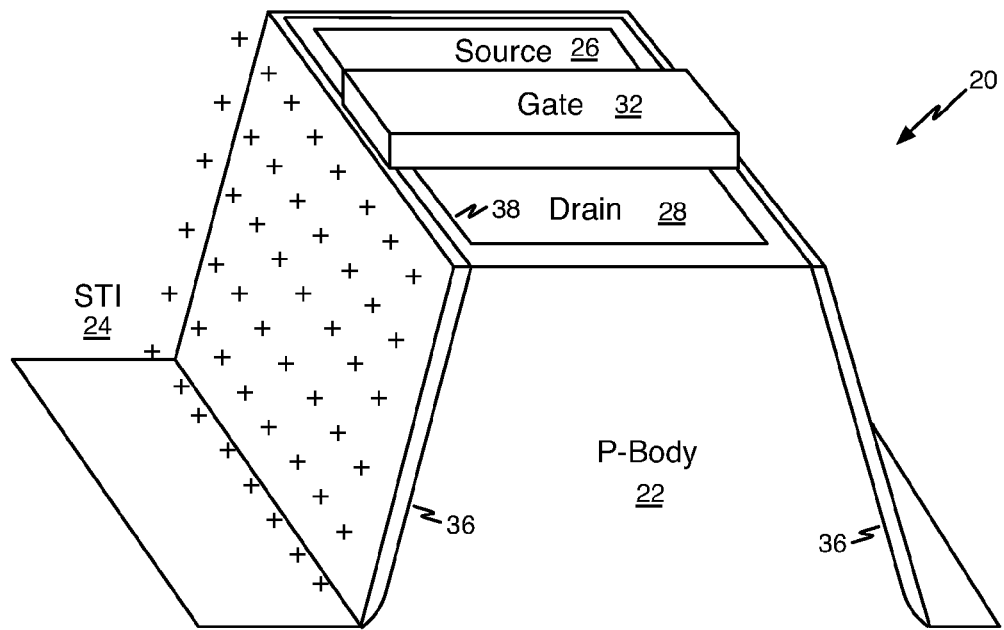
FIGS. 4A, 4B, and 4C are diagrams of an example layout of an STI isolated linear HV NMOS device according to another illustrative embodiment of the present invention.
Figure 4B:
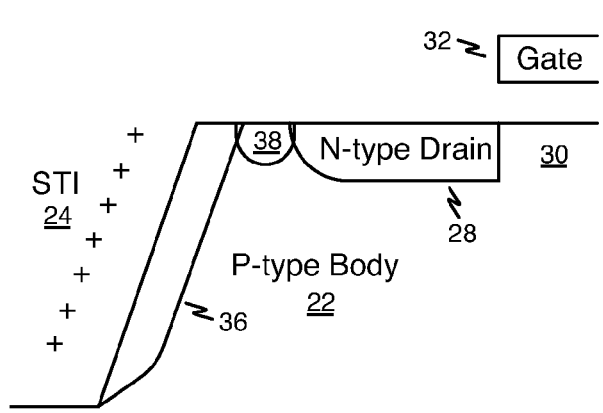
Figure 4C:
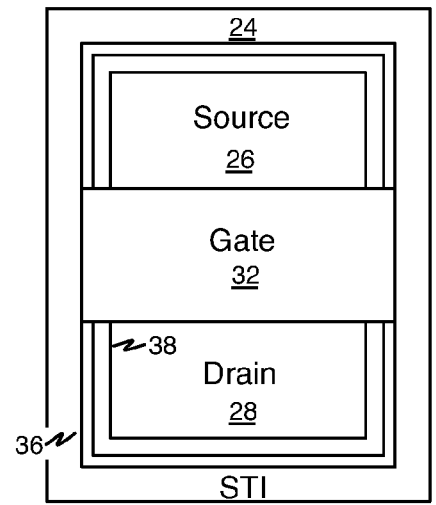

Referring now to FIGS. 4A through 4C, another embodiment of the present invention is shown. FIG. 4A is a three-dimensional drawing of the structure of a transistor 20 fabricated according to this aspect of the present invention. FIG. 4B is a cross-sectional view of the drain side of transistor 20 taken in a direction parallel to the channel. FIG. 4C is a top view of the transistor 20.

The embodiment shown in FIGS. 4A through 4C is a variant of the embodiment described with reference to FIGS. 3A through 3C. Instead of leaving a region 34 of the p-type well or substrate doping between the n-type source/drain implants and the diffusion edge, a lightly-doped n-type region 38 is formed in that area. Region 38 is a lightly-doped n-type region, but is higher in doping than the p-type body 22. In a typical embodiment, the n-type implant can be at a level of about $3 \times 10^{16}$ atoms/cm$^3$. Because of the light doping, the breakdown voltage ($BV_D$) of the drain to substrate junction will be high and lightly-doped n-type region 38 can overlap the source/drain implants and the p-type implant 36, making the alignment non-critical.

Figure 5A:
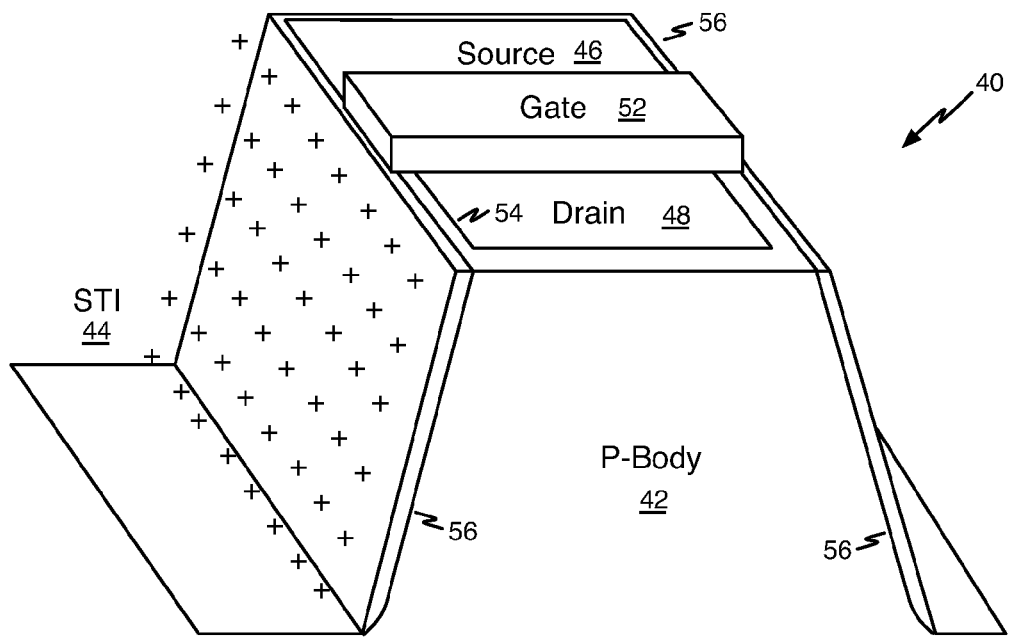
FIGS. 5A, 5B, and 5C are diagrams of an example layout of an STI isolated linear HV NMOS device according to another illustrative embodiment of the present invention.
Figure 5B:
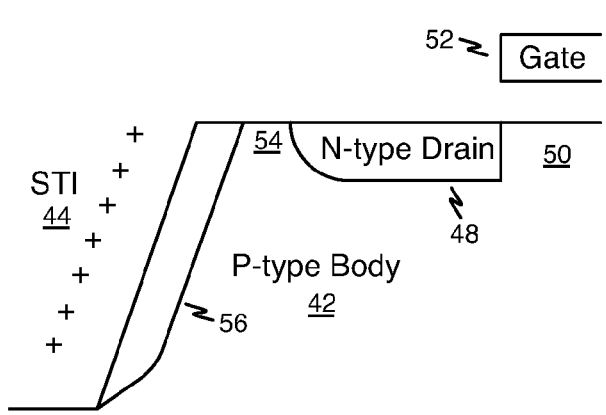
Figure 5C:
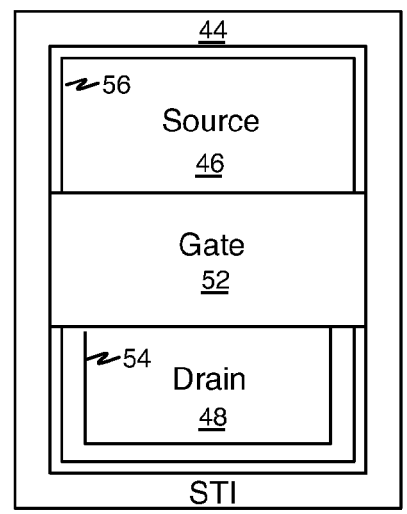

Referring now to FIGS. 5A through 5C, another embodiment of the present invention is shown. FIG. 5A is a three-dimensional drawing of the structure of a transistor 40 fabricated according to this aspect of the present invention. FIG. 5B is a cross-sectional view of the drain side of transistor 40 taken in a direction parallel to the channel. FIG. 5C is a top view of the transistor 40.

Like transistor 20 of the previously-described embodiment, transistor 40 is formed in p-type body 42, which may be a high-voltage triple well, including a body p-well in a deep-n-well in a p-substrate. Transistor 40 is isolated by STI region 44 that surrounds the transistor 40. Source 46 and drain 48 define a channel region 50 disposed under a polysilicon gate 52. A typical doping level for sources and drains is from about $1 \times 10^{19}$ atoms/cm$^3$ to about $1 \times 10^{20}$ atoms/cm$^3$.

In the embodiment of the present invention shown in FIGS. 5A, 5B, and 5C, only the drain 48 of the NMOS transistor 40 is electrically isolated from the trench sidewall by a lateral diode formed in cooperation with a region 54. This lateral diode is formed by pulling the n-type drain implant back from the diffusion edge, leaving region 54 of the p-type well or substrate doping. The perimeter of the diffusion is then implanted with additional p-type implant 56 to increase the parasitic threshold voltage and prevent punch-through to the inverted sidewall. P-type implant 56 is not shown at the front of the three-dimensional drawing of FIG. 5A in order to show the p-type body 42, although it is present there as shown in the top view of FIG. 5C. In a typical embodiment, the p-type implant 56 can be at a level of between about $1 \times 10^{17}$ and $1 \times 10^{18}$ atoms/cm$^3$.

Referring now to FIGS. 6A through 6C, another embodiment of the present invention is shown. FIG. 6A is a three-dimensional drawing of the structure of the transistor 40 fabricated according to this aspect of the present invention. FIG. 6B is a cross-sectional view of the drain side of transistor 40 taken in a direction parallel to the channel. FIG. 6C is a top view of the transistor 40.

The embodiment shown in FIGS. 6A through 6C is a variant of the embodiment described with reference to FIGS. 5A through 5C. Instead of leaving a region 54 of the p-type well or substrate doping between the n-type source/drain implants and the diffusion edge, a lightly-doped n-type region 58 is formed in that area. Region 58 is a lightly-doped n-type region, but is higher in doping than the p-type body 42. In a typical embodiment, the n-type implant 58 can be at a level of about $3 \times 10^{16}$ atoms/cm$^3$. Because of the light doping, the $BV_j$ of the drain to substrate junction will be high and can overlap the source/drain implants and the p-type implant 56, making the alignment of the implant 56 non-critical with respect to either of regions 50 and 58.

Figure 7A:
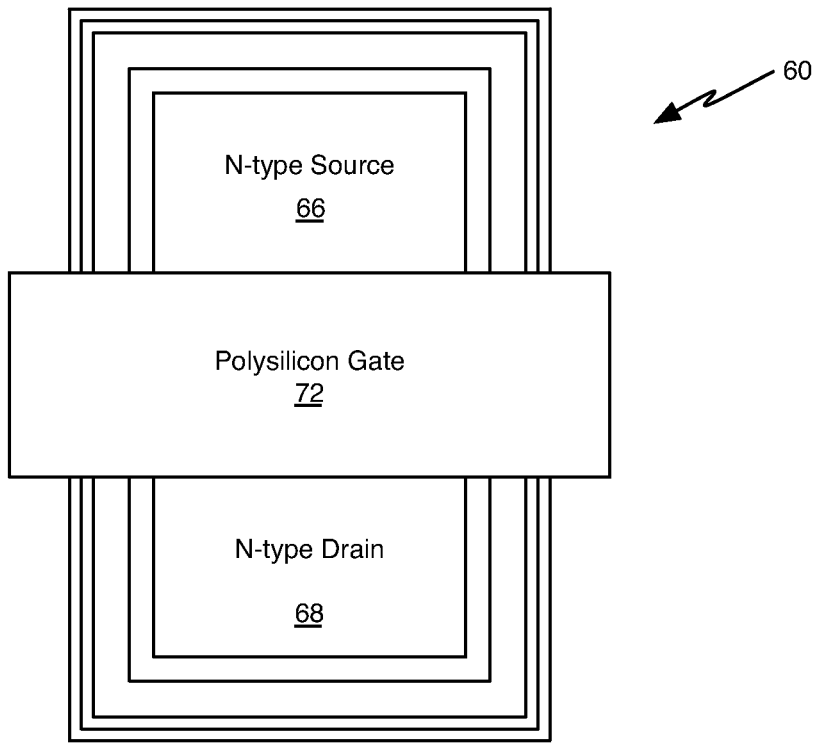
FIGS. 7A and 7B are diagrams of an example layout of an STI isolated linear HV NMOS device according to another illustrative embodiment of the present invention.
Figure 7B:
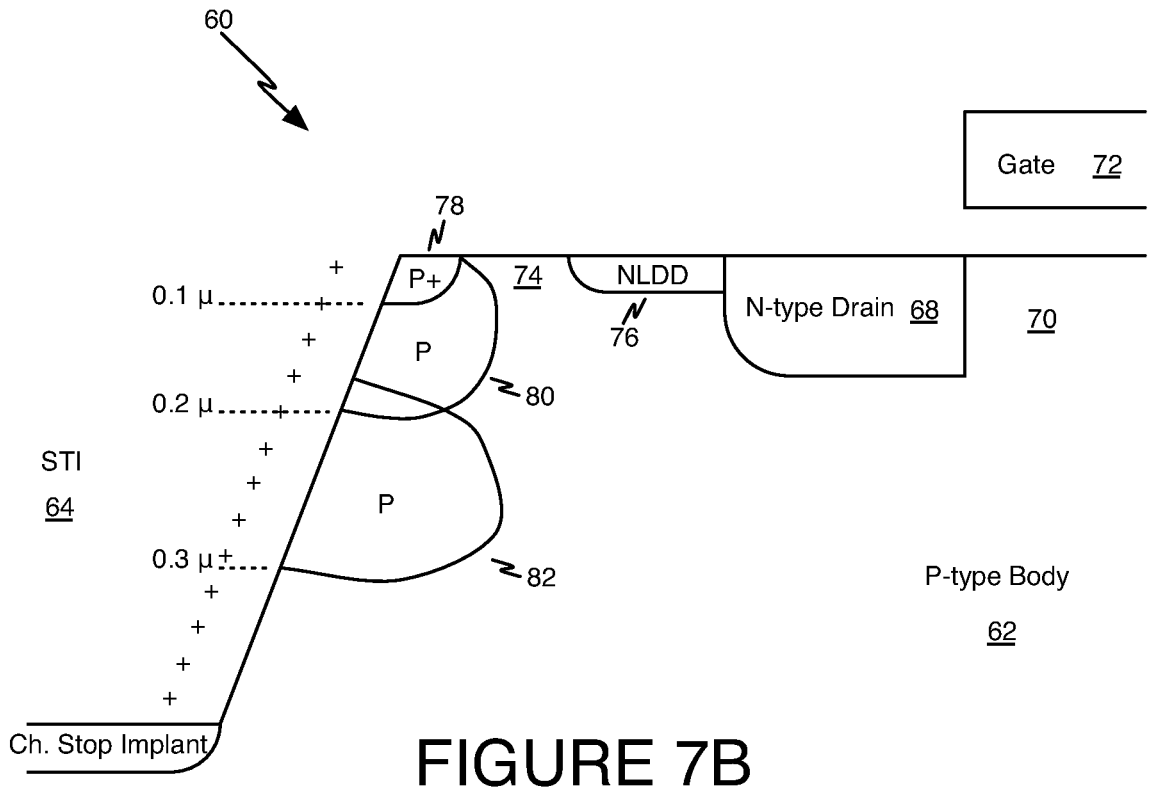

Referring now to FIGS. 7A and 7B, another embodiment of the present invention is shown. FIG. 7A is a top view of the structure of a transistor 60 fabricated according to this aspect of the present invention. FIG. 7B is a cross-sectional view of the drain side of transistor 60 taken in a direction parallel to the channel.

The NMOS transistor 60 resides in a p-well 62, which may be a high-voltage triple well, including a body p-well in a deep-n-well in a p-substrate. Transistor 60 is isolated by STI region 64 that surrounds the transistor 60. Source 66 and drain 68 define a channel region 70 disposed under a polysilicon gate 72. A typical doping level for sources and drains is from about $1 \times 10^{19}$ atoms/cm$^3$ to about $1 \times 10^{20}$ atoms/cm$^3$.

The lateral diode in NMOS transistor 60 is formed by pulling the N+ source and drain implant back from the diffusion edge at STI region 64, leaving only the body p-type well 62 (or substrate) doping to form a region 74. The source and drain junctions, respectively, with p-region 74 are then graded by introducing a region 76 of n-type lightly-doped-drain (NLDD) implant extending beyond the N+ source/drain regions in the direction of STI region 64. In an embodiment where the N+ source/drain diffusions have a doping level of between about $1 \times 10^{19}$ and about $1 \times 10^{20}$ atoms/cm$^3$, the NLDD implant can have a level of about $1 \times 10^{18}$ atoms/cm$^3$. The perimeter of the diffusion forming drain 68 is then implanted with a P+ implant 78 to create a very high parasitic $V_t$ for ionizing radiation immunity. Typical doping levels for p-type implant 78 are between about $1 \times 10^{19}$ and about $1 \times 10^{20}$ atoms/cm$^3$. The P+ implant 78 to p-well region 74 doping profile is graded by introducing a lighter p-type implant 80 encompassing the P+ region. Typical doping levels for p-type implant 80 are about $1 \times 10^{18}$ atoms/cm$^3$. Finally, another p-type implant 82, deeper than implant 80, is added at the diffusion edge of drain region 68 to increase the sidewall $V_t$ and prevent punch-through to the transistor sidewall under high junction stresses. Typical doping levels for p-type implant 82 are about $1 \times 10^{18}$ atoms/cm$^3$. All of these implants may be made using a species such as boron.

In embodiments of the invention illustrated in FIGS. 7A and 7B where the source of the transistor is at ground, the p-type isolation is only formed on the drain edges of the transistor, and, thus, not provided on the source edge of the transistor, which does not need to be protected from high voltage. This allows for a reduction in the "x"-pitch of the transistor layout without any degradation of either the TID robustness or the junction breakdown. In the embodiment shown in FIGS. 7A and 7B, both source 66 and drain 68 are surrounded by p-type isolation, Such transistors are used as, for example, pass devices that need high-voltage protection for both source 66 and drain 68 regions.

Figure 8A:
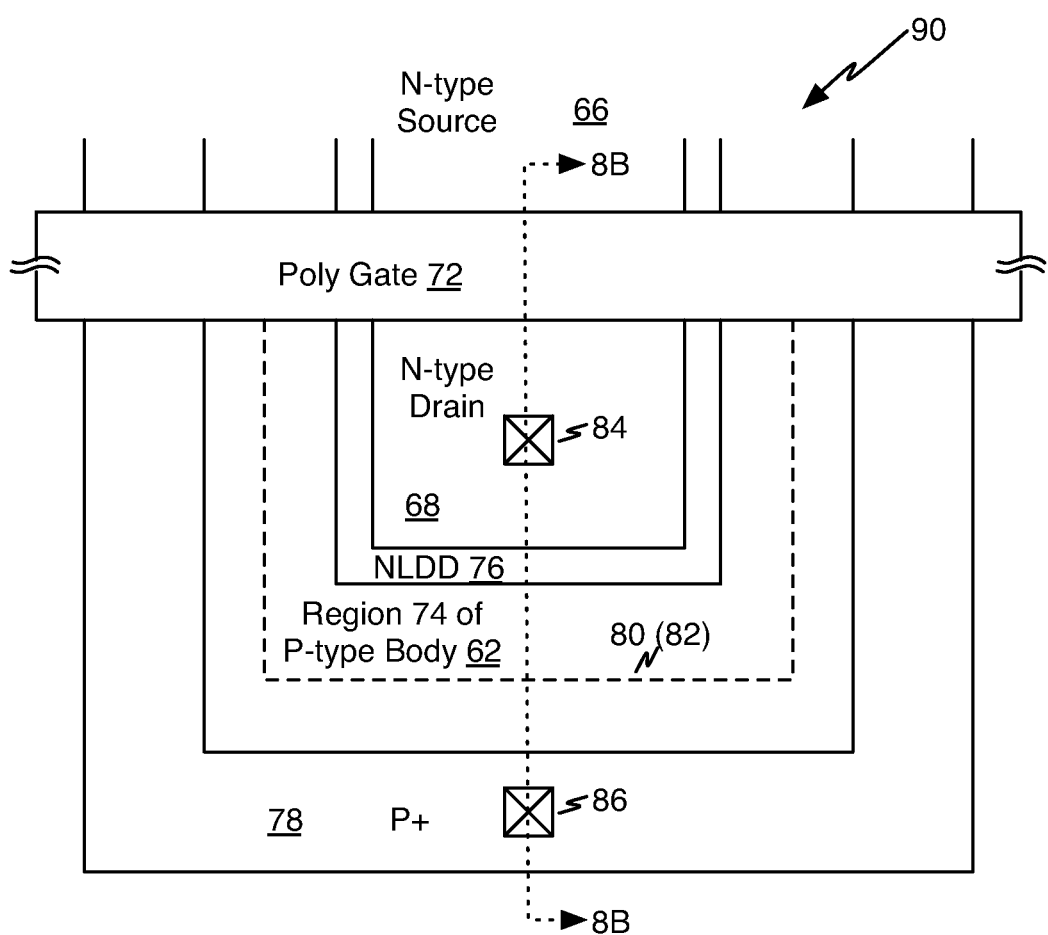
FIGS. 8A and 8B are diagrams of an example layout of an STI isolated linear HV NMOS device according to another illustrative embodiment of the present invention.
Figure 8B:
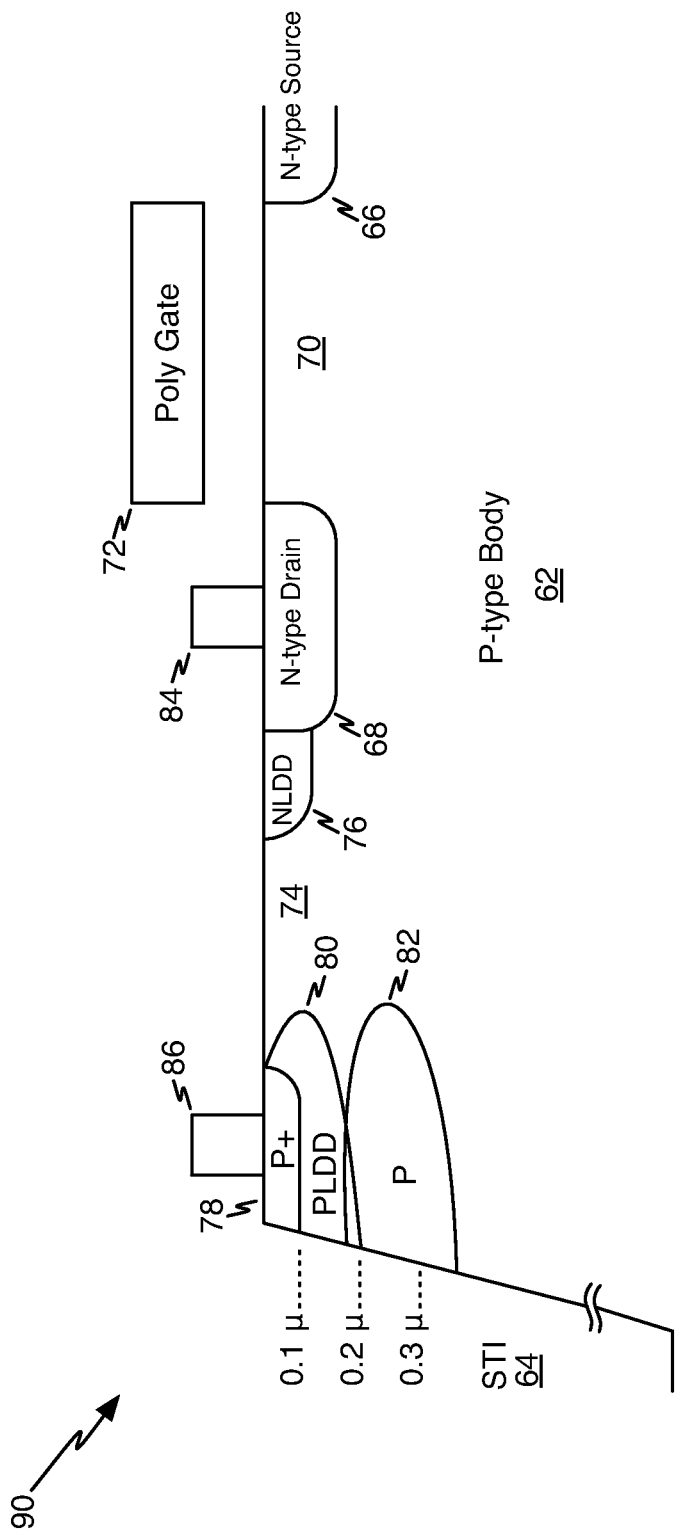

Referring now to FIGS. 8A and 8B, another embodiment of the present invention is shown. FIG. 8A is a top view of the structure of an NMOS transistor 90 fabricated according to this aspect of the present invention. FIG. 8B is a cross-sectional view of the NMOS transistor 90 taken in a direction parallel to the channel. Persons of ordinary skill in the art will recognize that NMOS transistor 90 of FIGS. 8A and 8B is similar to NMOS transistor 60. For an ease of understanding the invention, structures present in NMOS transistor 90 of FIGS. 8A and 8B that correspond to structures in NMOS transistor 60 of FIGS. 7A and 7B will be referred to using the same reference numerals used in FIGS. 7A and 7B to identify the corresponding structure.

The NMOS transistor 90 resides in a p-well 62, which may be a high-voltage triple well, including a body p-well in a deep-n-well in a p-substrate. Transistor 90 is isolated by STI region 64 that surrounds the transistor 90. Source 66 and drain 68 define a channel region 70 disposed under a polysilicon gate 72. A typical doping level for sources and drains is from about $1 \times 10^{19}$ atoms/cm$^3$ to about $1 \times 10^{20}$ atoms/cm$^3$.

A lateral diode is formed in transistor 90 by pulling the N+ source and drain implant back from the diffusion edge at STI region 64, leaving only the body p-type well 62 (or substrate) doping to form a region 74. The source and drain junctions are then graded by introducing a region 76 of NLDD implant extending beyond the N+ source/drain regions. In an embodiment where the N+ source/drain diffusions have a doping level of between about $1 \times 10^{19}$ and about $1 \times 10^{20}$ atoms/cm$^3$, the NLDD implant region 76 can have a level of about $1 \times 10^{18}$ atoms/cm$^3$. The perimeter of the diffusion forming the source and drain regions of transistor 90 is then implanted with a P+ implant 78 to create a very high parasitic threshold voltage for ionizing radiation immunity. Typical doping levels for p-type implant 78 are about $1 \times 10^{19}$ to about $1 \times 10^{20}$ atoms/cm$^3$. The P+ to p-well doping profile is graded by introducing a lighter p-type (PLDD) implant 80 encompassing the P+ region. This implant is normally used in p-channel transistors in the integrated circuit so no additional processing steps are required. Typical doping levels for PLDD implant 80 are about $1 \times 10^{18}$ atoms/cm$^3$. Finally, another p-type implant 82, deeper than implant 80, is added at the diffusion edge to increase the sidewall $V_t$ and prevent punch-through to the transistor sidewall under high junction stresses. Typical doping levels for p-type implant 82 are about $1 \times 10^{18}$ atoms/cm$^3$. All of these implants may be made using a species such as boron.

Drain contact 84 is shown at drain region 68 of transistor 90 in FIG. 8B. Body (bulk) contact 86 for the p-type body 62 is shown disposed in p+ region 78. Contact 86 is a salicided contact. Salicided contacts are well known in the art. As previously noted, recovery from a strike of ionizing radiation is limited by the impedance to the body tap. This determines both the rate at which the (primary) injected charge can be collected, as well as how much transient forward bias develops at the junction, injecting additional (secondary) charge. By placing salicided body contact 86 in p+ region 78, with increased doping as compared to that of body 62, the impedance to the body contact 86 is minimized, increasing the rate at which the injected charge can be collected, as well as lowering how much transient forward bias develops at the junction, minimizing the injection of additional (secondary) charge.

In the embodiment of the invention illustrated in FIGS. 8A and 8B, the p-type isolation is present only on the drain edges of the transistor 90. This allows for a reduction in the "x"-pitch of the transistor layout without any degradation of either the TID robustness or the junction breakdown.

Figure 2A:
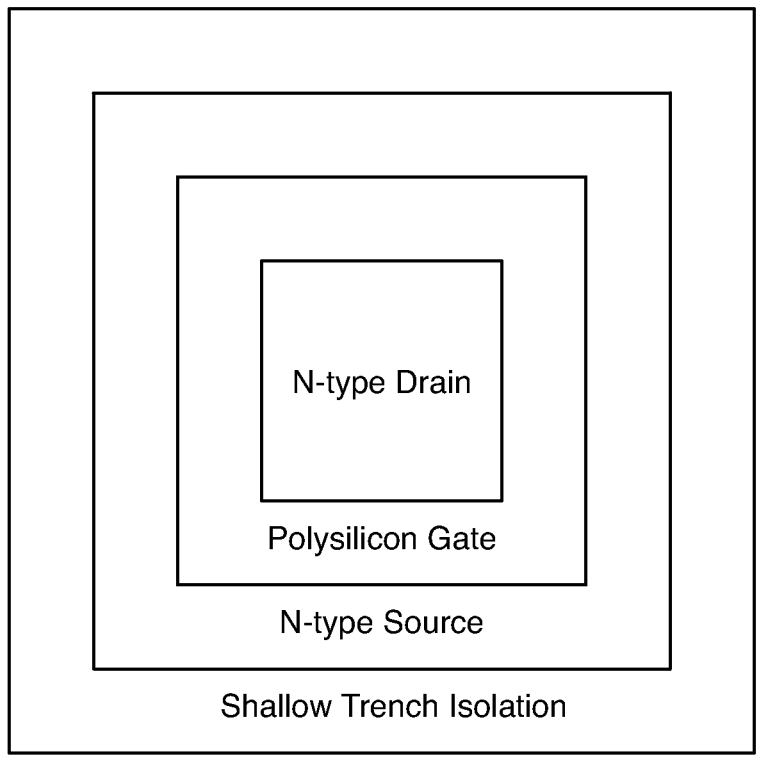
FIGS. 2A and 2B are diagrams of an example layout of an existing prior art annular gate transistor solution for constructing HV NMOS devices.
Figure 2B:
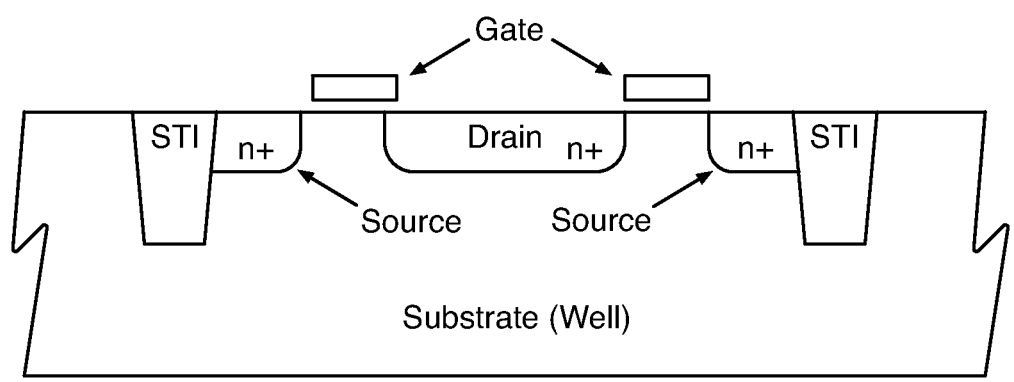

The present invention provides a significant total footprint reduction as compared to existing radiation-hardened layouts. It offers smaller source and drain junctions than the prior art circle gate structures of FIGS. 2A and 2B, reducing parasitic leakage and capacitance for better performance. The transistors are also readily scalable in channel width and length, which is critical for efficient circuit design. This invention can be implemented using a standard commercially-available semiconductor fabrication process without need for modification, achieving radiation hardness solely via device layout.

Persons of ordinary skill in the art will appreciate that the concepts of the present invention may be used to fabricate multiple transistors sharing a common central diffusion (e.g., a source region) with a pair of opposed drains extending in opposite directions from the central diffusion.

The transistors of the present invention are easily fabricated using standard CMOS process modules. First, the trenches are formed. The radiation-hardening p-type implant to the trench walls is then performed. Next, polysilicon for the gates is deposited. The gates are then defined. A p-channel mask is applied for the p-type isolation rings. Then, if the transistors are to be high-voltage transistors, an LDD implant is performed. Then an LDD mask is applied and the source/drain implants are performed. The process then continues as a conventional CMOS fabrication process.

In this specification, the relative term "high-voltage" or "HV" is used with respect to transistors. Persons of ordinary skill in the art will appreciate that these terms are interchangeable. Such skilled persons will also appreciate that a high-voltage transistor is a transistor able to withstand more than 5V, usually higher than 10V.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A radiation-hardened transistor, comprising:
   a p-type body well disposed in triple-well structure including a p-type substrate, a deep n-type well disposed in the p-type substrate, the p-type body well disposed in the deep n-well;
   an active region within the p-type body well having a perimeter defined by a shallow trench isolation region filled with a dielectric material;
   spaced-apart n-type source and drain regions disposed in the active region, forming a channel therebetween;
   a polysilicon gate disposed above, aligned with, and insulated from the channel region; and
   a p-type isolation region in the p-type body well formed on an inner sidewall of the shallow trench isolation region, the p-type isolation region spaced apart from the drain region separating outer edges of at least the drain region from the perimeter of the active region.

2. The transistor of claim 1, wherein the p-type isolation region separates outer edges of the source and drain regions from the perimeter of the active region.

3. The transistor of claim 1, further including a lightly-doped n-type region surrounding the outer edges of at least one of the source and drain regions, wherein the p-type isolation region is disposed outside of the lightly-doped n-type region.

4. The transistor of claim 1, further including lightly-doped n-type regions at outer peripheries of each of the source and drain regions.

5. The transistor of claim 1, wherein a portion of the p-type body well separates an inner edge of the p-type isolation region from the outer edges of at least the drain region.

6. The transistor of claim 1, wherein a portion of the p-type body well separates an inner edge of the p-type isolation region from the outer edges of the source and drain regions.

7. A radiation-hardened transistor, comprising:
a p-type body well disposed in triple-well structure including a p-type substrate, a deep n-type well disposed in the p-type substrate, the p-type body well disposed in the deep n-well;
an active region within the p-type body well having a perimeter defined by a shallow trench isolation region filled with a dielectric material;
spaced-apart n-type source and drain regions disposed in the active region, forming a channel therebetween;
a polysilicon gate disposed above, aligned with, and insulated from the channel region; and
a first p-type isolation region in the p-type body well formed at an inner sidewall of the shallow trench isolation region at the surface of the p-type body well, the p-type isolation region spaced apart from the drain region separating outer edges of at least the drain region from the perimeter of the active region.

8. The transistor of claim 7, wherein the first p-type isolation region includes a p-type implant at the surface of the active region.

9. The transistor of claim 8, further including a second p-type implant disposed below the first p-type implant and formed on an inner sidewall of the shallow trench isolation region.

10. The transistor of claim 7, further including a body contact disposed in the first p-type implant.

11. The transistor of claim 9, wherein the second p-type implant is doped to a concentration lighter than the concentration of first p-type implant.

12. The transistor of claim 9, further including a third p-type implant disposed below the second p-type implant and formed on an inner sidewall of the shallow trench isolation region.

13. The transistor of claim 11, wherein the second and third p-type implants are doped to a lighter concentration than the first p-type implant.

14. The transistor of claim 10, wherein the body contact is a salicided contact.

15. A radiation-hardened transistor, comprising:
a p-type body well disposed in triple-well structure including a p-type substrate, a deep n-type well disposed in the p-type substrate, the p-type body well disposed in the deep n-well;
an active region within the p-type body having a perimeter defined by a shallow trench isolation region filled with a dielectric material;
spaced-apart n-type source and drain regions disposed in the active region, forming a channel therebetween;
a polysilicon gate disposed above, aligned with, and insulated from the channel region; and
a p-type isolation region in the p-type body formed on an inner sidewall of the shallow trench isolation region, the p-type isolation region separating outer edges of at least the drain region from the perimeter of the active region.

16. The transistor of claim 15, wherein the p-type isolation region separates outer edges of the source and drain regions from the perimeter of the active region.

17. The transistor of claim 15, further including a lightly-doped n-type region surrounding the outer edges of at least one of the source and drain regions, wherein the p-type isolation region is disposed outside of the lightly-doped n-type region.

18. The transistor of claim 15, further including lightly-doped n-type regions at outer peripheries of each of the source and drain regions.

19. The transistor of claim 15, wherein a portion of the p-type body separates an inner edge of the p-type isolation region from the outer edges of at least the drain region.

20. The transistor of claim 15, wherein a portion of the p-type body well separates an inner edge of the p-type isolation region from the outer edges of the source and drain regions.

* * * * *